United States Patent [19]
Fimoff et al.

[11] Patent Number: 5,424,733
[45] Date of Patent: Jun. 13, 1995

[54] PARALLEL PATH VARIABLE LENGTH DECODING FOR VIDEO SIGNALS

[75] Inventors: Mark Fimoff, Hoffman Estates; Timothy G. Laud, Mundelein; Ronald B. Lee, Northbrook, all of Ill.

[73] Assignee: Zenith Electronics Corp., Glenview, Ill.

[21] Appl. No.: 18,668

[22] Filed: Feb. 17, 1993

[51] Int. Cl.[6] .............................................. H03M 7/42
[52] U.S. Cl. ......................................... 341/67; 341/65
[58] Field of Search ..................................... 341/65, 67

[56] References Cited

U.S. PATENT DOCUMENTS 4,394,774  7/1983  Widergren et al. .................... 382/56
5,138,315  8/1992  Le Queau et al. .................... 341/67

*Primary Examiner*—Howard L. Williams

[57] ABSTRACT

A digital data processing system receives compressed variable length encoded digital data in the form of variable length codewords in contiguous variable speed Blocks of data. The boundary signals between adjacent codewords are determined and a demultiplexer sequentially sorts the serial digital data among a plurality of parallelly connected buffers for reducing the bit read speed of the buffers. A corresponding plurality of variable length decoders decodes the data from the buffers and outputs the data in parallel form to a multiplexer where it is reassembled into a serial expanded data stream. The incoming data includes selector information in fixed length headers that are separated, buffered and variable length decoded for controlling the demultiplexer. In one aspect of the invention, the data is sorted into substantially equal sized groups of integral codewords for equalizing the loading of the parallel buffers. In another aspect of the invention, the Block boundary marker signals are processed through much smaller auxiliary buffers using counters to keep track of the Block boundary marker signals for synchronization with the data flowing through the buffers.

12 Claims, 3 Drawing Sheets

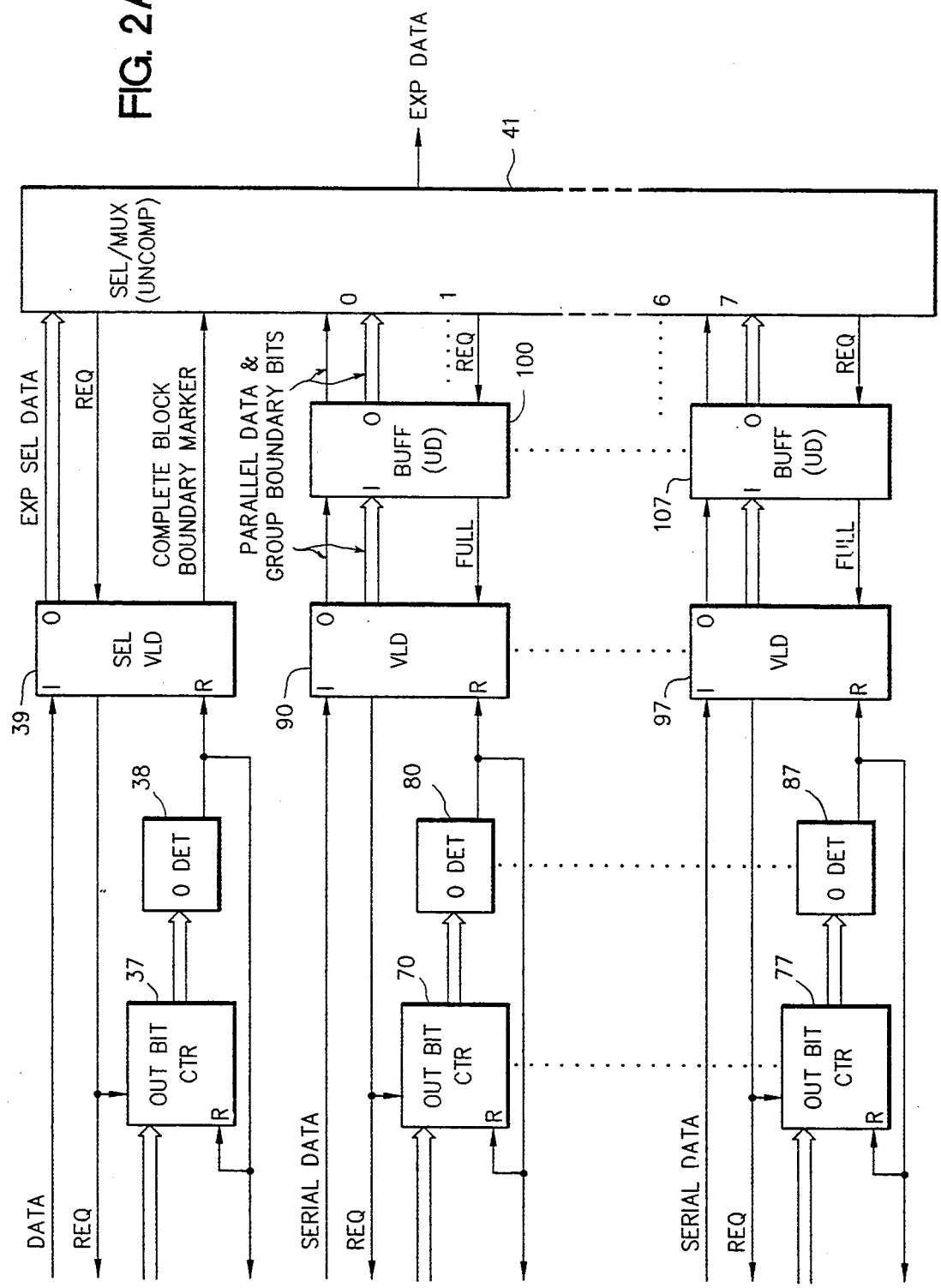

PARALLEL PATH VARIABLE LENGTH DECODING FOR VIDEO SIGNALS

CROSS REFERENCE TO RELATED APPLICATIONS

This application is related to U.S. Pat. No. 5,285,276, entitled TELEVISION SIGNAL TRANSMISSION SYSTEM WITH TWO LEVELS OF SYMBOL ENCODING, filed, in the name of R. Citta and discloses an invention claimed in copending application Ser. No. 08/018,658, filed Feb. 17, 1994, entitled A METHOD OF PROCESSING VARIABLE SIGNAL BLOCKS OF DATA, in the names of the present inventors, all of which are assigned to Zenith Electronics Corporation.

BACKGROUND OF THE INVENTION AND PRIOR ART

This invention relates in general to data processing systems and in particular to a video data recovery and expansion system for use in connection with a digital high definition television system. The recently tested high definition television system of Zenith Electronics Corporation and AT&T Corporation includes a video compression scheme for compressing 37 MHz information for transmission over a 6 MHz wide television channel.

U.S. Pat. No. 5,285,276 describes a temporally oriented video compression system in which compressed video information is transmitted in the form of motion vectors and difference signals with the motion vectors identifying previous portions of a frame of video that closely match the current portion and the difference signals representing the differences between the previous and current portions. The video information has a bandwidth of about 37 MHz and may comprise a progressively scanned video signal in the form of successive frames of binary video data having a vertical periodicity equal to the NTSC standard (i.e. about 59.4 Hz) and a horizontal periodicity equal to three times the NTSC standard (i.e. about 47.25 KHz). The data is in the form of a series stream of binary pixel values that have been transform coded in the frequency domain to develop discrete cosine transform coefficients. The transform coding process provides a series of clusters of spectral transform coefficients for each frame of video, with each cluster of coefficients corresponding to a different spatial region of the video image. Each cluster, for example, may comprise an $8 \times 8$ array of coefficients with 14,400 clusters representing an entire video frame. The coefficient clusters are serially applied to a perceptual modelling system which develops an output that reflects the perceptual nature of the corresponding portion of the video image. The video data is then compressed in accordance with a selected compression algorithm. One well-known compression technique does not send all of the transform coefficients, the coefficients whose omission will have the least noticeable effect on the received image being dropped. The remaining coefficients are variable length encoded and sent as a series of codewords of unequal bit length, with the shortest codewords being assigned to those values that are most probable.

As further discussed in U.S. Pat. No. 5,285,276, the data may be ranked by importance, i.e. control data may be sent in more robust initial data segments, followed by data of the next level of importance such as motion vectors, etc. It will be noted that the number of motion vectors and difference signals may vary from frame to frame depending upon the perceptual nature of the video information in the frame and its relationship to the previous frame. The compressed variable length encoded information is assembled into Blocks consisting of a fixed number of $8 \times 8$ coefficient arrays, from most of which some coefficients have been omitted. Included with each Block is a Block header referred to as a selector, that consists of a fixed number of variable length encoded codewords containing the selector information. The selector information identifies which coefficients have been omitted from the $8 \times 8$ arrays in the Block and the total number of coefficients in the Block. The Blocks are assembled into data frames, each frame comprising a preselected number of equal length data segments. Each data segment has an initial fixed length segment sync portion, a fixed length data segment header and Block data, i.e. selector and coefficient data. The data segment header has a pointer that indicates the location in the data segment where the first Block beginning, if any, in that data segment occurs. Thus the selector data and coefficient data may be recovered by counting codewords and coefficients.

It will be noted that since the size of a Block is variable and the size of a data segment is fixed, the number of Blocks in a data segment will vary in accordance with the amount of compression. Therefore, several Blocks may be contained in a single data segment, or a single Block of data may extend over several data segments. As to the variable length encoding of the Block data, any of a well known number of encoding systems may be used such that the data or codewords may be joined, i.e. sequentially transmitted without breaks therebetween. The receiving system can produce a state table for determining the boundaries or junctions between adjacent codewords. The encoding form known as Huffman encoding is presently preferred. This is all by way of background to the present invention which will be understood not to be restricted to any particular form of encoding or processing.

The problem solved by the present invention is caused by the high data rate of the expanded data, which requires the buffer memories to have very high read speeds. Such high read speeds are attainable only at very high cost. The present invention is directed to a system for significantly reducing the need for buffer memories requiring high reading speeds.

OBJECTS OF THE INVENTION

A principal object of the invention is to provide a novel digital data processing system.

Another object of the invention is to provide a digital data processing system of extremely high data rate that does not require expensive high speed memories.

A further object of the invention is to provide an improved system for expanding variable length encoded data.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
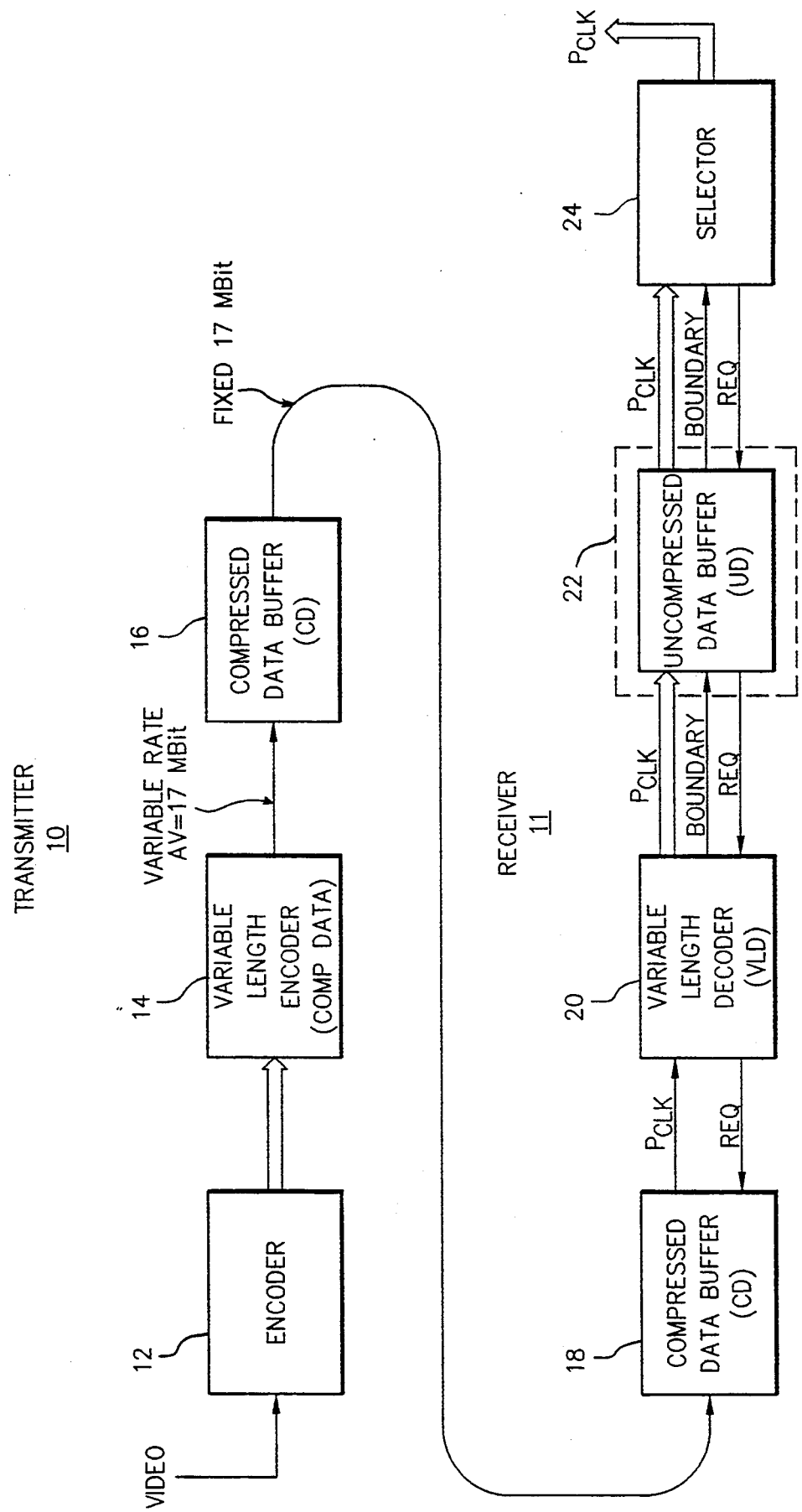
FIG. 1 is a block diagram of a television transmission system utilizing the invention.

In FIG. 1, a transmitter 10 includes an encoder 12 for receiving video from a suitable source and processing it in any of a variety of ways, including the one specified in the above-entitled U.S. Pat. No. 5,285,276, i.e. by developing motion vectors and discrete cosine transform coefficients for the difference signals. The data is supplied to a variable length encoder 14 in which the data is compressed and formatted in the form of codewords of variable length. The output of variable length encoder 14 is at a fixed video frame rate resulting in a variable data rate which, in accordance with the preferred embodiment, averages about 17 megabits per second. The variable rate data is applied to a compressed data (CD) buffer 16 which outputs data at a fixed data rate of 17 megabits per second. The data is transmitted by any suitable means, e.g. over the air or by cable, to a receiver 11 which includes a compressed data buffer (CD) 18, a variable length decoder (VLD) 20, an uncompressed data buffer (UD) 22 and a selector 24. The uncompressed data buffer 22 is shown in a dashed line block to simplify the operational description of the processing system.

The receiver requirements can best be understood by considering that selector 24 must provide pixel data in parallel form (at an assumed 8 bits per pixel), at a rate of about 75 megabytes per second. This 75 megabytes per second rate is referred to as the pixel clock (pclock). To achieve this rate, selector 24 requests data as needed (in parallel form) from VLD 20 via its request (req) line. The selector adds or fills in 0's for omitted coefficients in the transmitted Blocks of data. It therefore doesn't request as much data from VLD 20 for a Block that has omitted coefficients. The result is a relatively low data rate between VLD 20 and selector 24 when processing that Block. For Blocks of data with no coefficients dropped, selector 24 must receive all coefficients at the pclock rate. To supply selector 24 with data at the pclock rate, VLD 20 must request data from CD buffer 18 at the rate of one variable length codeword per pclock. For example, assume a time period in which all incoming variable length codewords are of maximum 8 bit length. Because VLD 20 receives data serially, the data rate is 8×pclock between CD buffer 18 and VLD 20. This is a very high rate (8×75 MHz) at which to read data out of conventional memory. Hence, the CD buffer 18 in the receiver is placed before VLD 20 to keep the buffer size reasonable. (Buffering after VLD 20 would require a buffer of much larger size.)

A circuit modification that helps to reduce the buffer size includes another buffer UD 22 in the dashed line box. Since worst case situations (no significant compression of data) will persist for relatively short and infrequent time periods, UD 22 provides data to selector 24 at the pclock rate while reading data from VLD 20 at a somewhat lesser rate. The result is that the rate at which data is read from CD buffer 18 is somewhat reduced. However, UD buffer 22, which stores expanded data, would need to be very large to effect a significant reduction in the data rate from CD buffer 18. The problem remains in that the high data rate between the CD buffer and the VLD requires the use of a very expensive high speed memory for the compressed data buffer.

Figure 2:
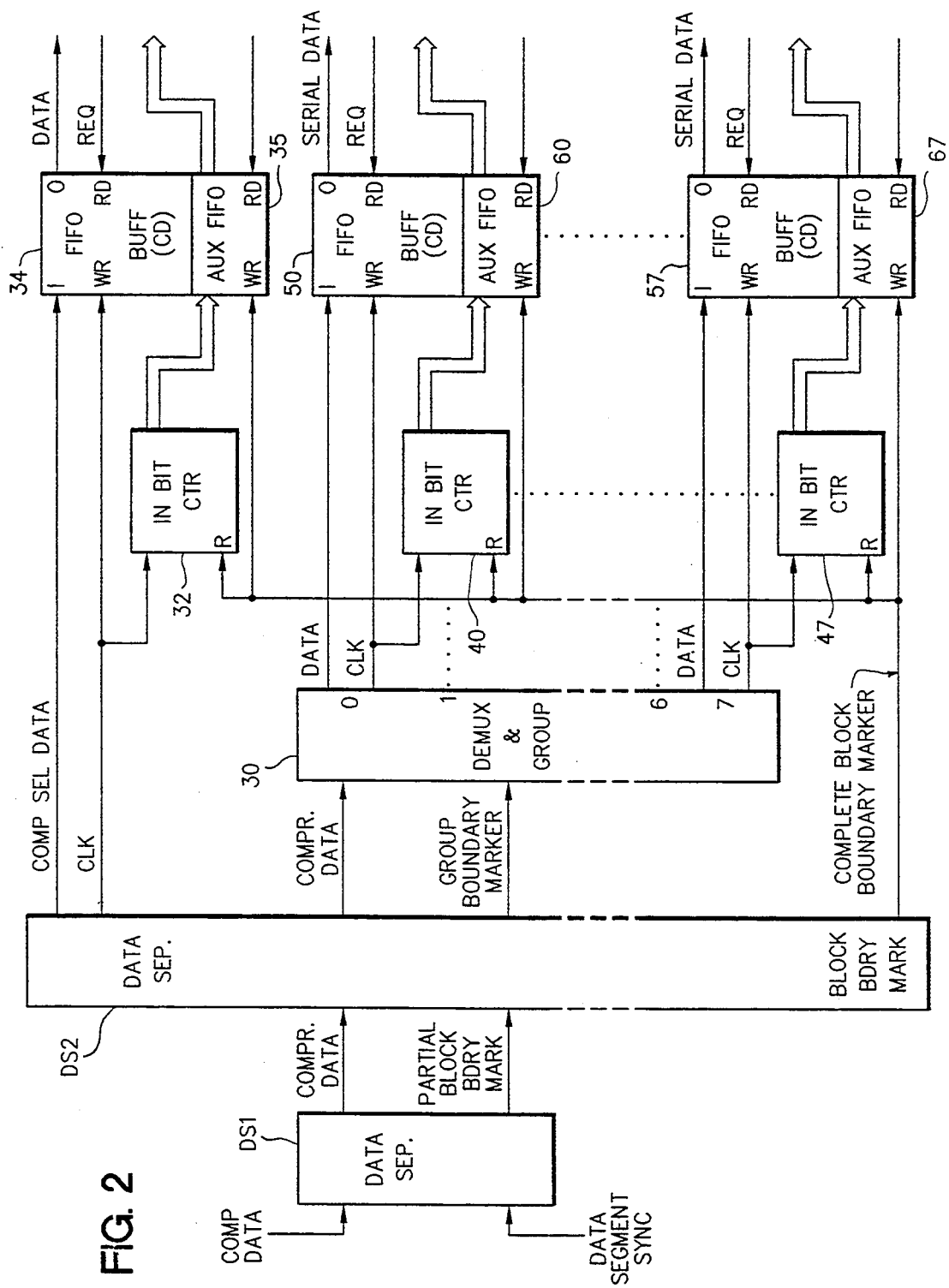
FIG. 2 is a block diagram illustrating operation of the invention.

The invention significantly reduces the reading speed requirement for the compressed data buffer by splitting the data among a number of buffers that operate in parallel. Referring to FIG. 2, compressed data and data segment sync signals are applied to a first separator DS1. The data segment sync signals mark the boundaries between each of the fixed length data segments. DS1 separates the data segment header from the Block data in the data segments and sends the Block data to a compressed data output. DS1 determines the starting points in the compressed data stream for some of the Blocks, i.e. the first Block beginning, if any, in a data segment from the data segment header information. Specifically, a pointer in the data segment header points to the first Block beginning in the data segment. This information is used to create a partial Block boundary marker signal for synchronization of the subsequent circuitry. The compressed data and partial Block boundary marker signals are applied to a second data separator DS2.

DS2 includes means for finding the separation points between each of the individual variable length codewords in the compressed data stream. Such means may conveniently take the form of separate variable length decoders that are dedicated primarily to the task of finding these codeword boundaries. A partial Block boundary marker signal from DS1 identifies a known, fixed number of following codewords as selector data for the Block. A variable length decoder decodes the data counting this known, fixed number of codewords to identify the boundary in the compressed data stream between the selector data and the coefficient data. The compressed selector data is sent to the compressed selector data output of DS2 and the subsequent coefficient data is sent to the compressed data output of DS2. The portion of the decoded selector data that identifies the number of coefficient codewords in the Block is saved and used to control the VLD which decodes the identified number of coefficient codewords before the next Block (and the new selector data) is encountered. DS2 stops routing the compressed data stream to the compressed data output and switches back to the compressed selector data output at that point. The remainder of the decoded selector data and all of the decoded coefficient data is discarded in DS2. DS2 also generates a group boundary marker signal that denotes the boundaries between groups (i.e. an integral number of codewords) in the compressed coefficient data stream at the compressed data output. The integral number is determined according to an algorithm to be discussed. In the event of errors in the received data, the variable length decoders in DS2 will be quickly resynchronized by the partial Block boundary marker signal from DS1. The compressed data and group boundary marker signals are applied to a demultiplexer and grouper 30 for demultiplexing and assembling the codewords into groups (determined by the algorithm) consisting of an integral number of codewords, the boundaries between the groups being determined by the group boundary marker signal. The compressed selector data signal from DS2 is supplied, along with a data clock signal, to a compressed data buffer 34.

The clock signal is supplied to the WR (write) terminal of a CD buffer 34, while the data signal is applied to its I (input) terminal. The output terminal O of buffer 34 supplies the compressed selector data to a selector data variable length decoder 39. VLD 39 controls the rate of transmission of data from buffer 34 by means of a request line which is coupled to the R (read) terminal of buffer 34. The partial Block boundary marker signal supplied from DS1 to DS2 is present for only the firstoccurring Block beginning in a data segment as described above. DS2 also develops a complete Block boundary marker signal that identifies each Block boundary when the separation points between the end of the compressed coefficient data and the beginning of the compressed selector data, as described above, are determined. An auxiliary buffer 35 is operated in parallel with buffer 34 for maintaining synchronism between the data (as it is processed) and the complete Block boundary marker signals.

An input bit counter 32 and an output bit counter 37 flank the auxiliary buffer 35. The data clock signal is applied to input bit counter 32. The count value of input bit counter 32 is supplied to the data input of the auxiliary buffer 35. The reset terminal of input bit counter 32 and the write terminal of auxiliary buffer 35 are supplied with the complete Block boundary marker signal from DS2. The output of auxiliary buffer 35 is applied via a parallel load bus to output bit counter 37 which is stepped by the request signal from VLD 39. The count value of output bit counter 37 is supplied to an "all zero" detector 38 which develops a reset signal for VLD 39, for counter 37 and a lead signal for auxiliary buffer 35. The selector data is applied to a selector/multiplexer 41 for controlling operation thereof. VLD 39 also generates a complete Block boundary marker signal for selector/multiplexer 41. As indicated, the buffers 34 and 35 are of the first-in, first-out (fifo) type that are well known in the art.

The particular arrangement for processing the complete Block boundary marker signal and the data through the compressed buffers to maintain synchronism therebetween is specifically claimed in copending application Ser. No. 08/018,658, filed Feb. 17, 1994.

Returning to DS2, demultiplexer and grouper 30 accepts the incoming serial data and the group boundary marker signal from DS2 and apportions the data into groups, each consisting of an integral number of codewords, among a plurality of parallelly connected compressed data buffers 50–57. The dashed line joining the buffers 50–57 indicates that buffers, corresponding to output terminals 1–6 of the demultiplexer and grouper 30, are omitted. It will be understood that the output terminals 0–7 are arbitrary in number and that each output terminal has the same processing structure, i.e. buffers and variable length decoders, connected thereto. It will therefore suffice to describe operations for one output, it being understood that data at the other outputs is processed in an identical manner.

The data from terminal O is applied to the input terminal of CD buffer 50. The data clock signal is applied to the WR terminal of CD buffer 50 and to an input bit counter 40. An auxiliary buffer 60, an output bit counter 70 and a zero detector 80 are connected in a manner similar to the connection of auxiliary counter 35, output bit counter 37 and zero detector 38 described above. A variable length decoder 90 receives the serial data from CD buffer 50, decodes it, and applies the decoded data in a parallel format to an uncompressed data buffer 100. The output of uncompressed buffer 100 is supplied to the selector and multiplexer 41, which also includes means for uncompressing the compressed data. It will be noted that the VLD by its nature converts compressed data to a fixed length output and broadly performs some expansion. In practice, the variable length encoded codewords are decoded to a fixed 8 bit length. This is distinct from the uncompressing of the compressed data that occurs after the VLD.

A similar arrangement of elements coupled to output terminal 7 of demultiplexer and grouper 30, i.e. CD buffer 57, auxiliary buffer 67, bit counters 47 and 77, VLD 97 and uncompressed buffer 107 function in the same way to develop a parallel output of a block of data, which is assembled into a single serial stream by selector/multiplexer 41.

The parallel buffer arrangement will now be discussed. As mentioned, the incoming data is formatted such that the boundaries between codewords can be determined in the decoding process. Since the uncompressed data can reach extremely high rates, the plurality of parallel buffers 50–57 is employed to operate on sequential portions of the data stream. Since the required speed for each buffer is effectively divided by the number of buffers, relatively low cost fifo memories may therefore be used for the buffers. With the codewords being of variable length, the grouping of the codewords to load the parallel buffers substantially equally is very important. The sizes or bit lengths of the codeword groups are determined with an algorithm based upon selecting a nominal group bit length equal to the maximum codeword size and adding successive codewords until the nominal size is reached or exceeded. When this occurs, the nominal bit length is subtracted from the actual number of totalled bits and compared with another total developed from the difference between the totalled number of bits minus the last-added codeword. The codeword arrangement that provides the smallest difference is selected as the group and demultiplexer 30 supplies that group of data to buffer 50 and switches to its next output for the next group of data. The process proceeds in a cyclical manner with each of the outputs of demultiplexer and grouper 30 receiving a group of data for its associated buffer. With the arrangement, the loading of the buffers is substantially equalized so that no one buffer is loaded significantly faster or more fully than any other buffer. This contributes greatly to system economy and enables the smaller size buffers to process the information. It will be appreciated that the number of buffers need not be eight, but any number can be employed with equal effect. This invention is the subject matter of the present application.

The other aspect of the invention, which is claimed in copending application Ser. No. 08/018,658, filed Feb. 17, 1994, is the provision of the input and output bit counters to enable the use of an auxiliary buffer of a significantly smaller size than the CD buffer while preserving synchronism between the data that is being supplied to the CD buffer and the complete Block boundary marker signal. Counter 40, for example, counts up the bits written into CD buffer 50 until it is reset by the complete Block boundary marker signal. This signal is a pulse in which the trailing edge acts as a reset signal. The count total of counter 40 is transferred (as a parallel N bit word) to the auxiliary buffer 60 when its WR input is activated by leading edge of the complete Block boundary marker signal. Both CD buffer 50 and auxiliary buffer 60 are of the fifo variety, and as the data is serially transferred to buffer 50, the N bit word, representing the number of bits in the Block of data, is clocked along. The Block of data supplied to buffer 50 may comprise a number of groups totalling many hundreds of bits in length whereas the corresponding word in auxiliary buffer 60 is only a few (N) bits long. When VLD 90 requests data from buffer 50, the parallel data in auxiliary buffer 60, is loaded into the output counter 70 and the counter begins to count down in response to signals on the request line. When the counter counts down to all zeros, the zero detector 80 generates a reset signal, which is applied to VLD 90, counter 70 and auxiliary buffer 60. Thus the synchronization of the compressed data and the Block boundary marker signal is maintained without requiring a duplicate size buffer for handling the boundary signal.

N is readily determined by letting X equal the maximum number of expected coefficient bits in a Block. Since there are eight parallel paths and the X bits are approximately equally distributed to each of the parallel paths (CD buffers), any given buffer will hold a maximum of X/8 bits. Since the binary representation of N is $\log_2(X/8)$, the input and output bit counters must be N bits wide.

As mentioned previously, selector VLD 39 reads data out of CD buffer 34 and provides decoded selector data to the selector/multiplexer 41. In response to the reset signal from zero detector 38 which corresponds to the Block boundary points, VLD 39 sends a new complete Block boundary marker signal (corresponding to the original Block boundary marker signal) to the selector/multiplexer 41.

The parallel VLD's (90-97) read data out of their corresponding CD buffers (50-57), decode the data and output it in parallel form to their corresponding UD buffers (100-107). VLD's 90-97 also keep track of codeword groups generated according to the previously described grouping algorithm and produce group boundary signals (bits) which are passed to the UD buffers along with the decoded codewords. The codeword data and group boundary signals pass through the UD buffers and are available to the selector/multiplexer 41.

The selector/multiplexer 41 outputs expanded coefficient data at the pclock rate. In response to the reset (complete Block boundary marker signal) from selector VLD 39, selector/multiplexer 41 reads the selector data for the current Block of data from selector VLD 39. This information indicates which coefficients have been omitted from the Block of data and the total number of coefficients in the Block. Thus, the number of coefficients to be read from the parallel coefficient UD buffers is determined and the point at which selector data must be read for the next Block of data from selector VLD 39 is ascertained. The selector/multiplexer fills in 0's for the omitted coefficients.

To maintain proper ordering of the data at the output of the selector/multiplexer, data must be read from the parallel UD buffers a group of codewords at a time. This grouping is determined by the previously described group boundary marker signals.

What has been described is a novel data processing system for expanding compressed data among a plurality of parallel buffers such that the need for expensive buffers of high read speed is minimized. It is recognized that numerous changes in the described embodiment of the invention will be apparent to those skilled in the art without departing from its true spirit and scope. The invention is to be limited only as defined in the claims.

What is claimed is:

1. A method of processing digital data received at a constant bit rate and being formed into variable length encoded codewords comprising:
    initially decoding said digital data to identify codeword boundaries therein;
    developing boundary signals denoting the boundaries of groups of said integral codewords;
    dividing the data into similar length ones of said groups under control of said boundary signals;
    distributing said similar length groups of integral codewords sequentially among a plurality of parallel buffers;
    variable length decoding the digital data from said buffers; and
    sequentially combining the data into a serial stream.

2. The method of claim 1 wherein said groups have a given nominal bit total L and further comprising:
    adding successive ones of said codewords until a first bit total T1 is equal to or greater than L; and
    if T1 is equal to L, identifying a group;
    if T1 is greater than L, subtracting the last codeword to obtain a second bit total T2; and
    if T1−L is greater than L−T2, identifying T2 as a group;
    if T1−L is less than L−T2, identifying T1 as a group;
    if T1−L equals L−T2, identifying either T1 or T2 as a group.

3. The method of claim 1 wherein said initially decoding comprises variable length decoding said data to identify said codeword boundaries therein.

4. The method of claim 3, further comprising:
    supplying data from said buffers to a corresponding plurality of variable length decoders for decoding said data;
    developing parallel data from said variable length decoders; and
    recombining said parallel data into serial data.

5. A video processing system comprising:
    means for receiving constant bit rate digital data in the form of variable length coded codewords;
    first variable length decoding means for determining boundary signals indicating boundaries between adjacent codewords;
    demultiplex and grouping means for distributing substantially equal size groups of said codewords sequentially among a plurality of outputs under control of said boundary signals;
    a plurality of buffers connected to said plurality of outputs for receiving said groups;
    second variable length decoding means coupled to said plurality of buffers for decoding said groups and producing parallel data therefrom; and
    multiplexing means coupled to said second variable length decoding means for combining said parallel data to form a serial stream of data.

6. The processing means of claim 5 wherein said digital data is formatted into portions comprising a header including variable length encoded selector data;
    means for separating said selector data;
    third variable length decoding means for variable length decoding said separated selector data; and
    means for utilizing said selector data for controlling said multiplexing means.

7. A method of processing compressed digital data received at a constant bit rate and being formed into variable length encoded codewords comprising:
    initially decoding said digital data to identify codeword boundaries therein;
    developing boundary signals denoting the boundaries of groups of said integral codewords;
    dividing the data into similar length ones of said groups under control of said boundary signals;

distributing said groups of integral codewords sequentially among a plurality of parallel buffers;

variable length decoding the digital data from said buffers;

uncompressing the digital data; and sequentially combining the uncompressed data into a serial stream.

8. The method of claim 7 wherein said groups have a given nominal bit total L and further comprising:

adding successive ones of said codewords until a first bit total T1 is equal to or greater than L; and if T1 is equal to L, forming a group;

if T1 is greater than L, subtracting the last codeword to obtain a second bit total T2; and if T1−L is greater than L−T2, using T2 as a group;

if T1−L is less than L−T2, using T1 as a group;

if T1−L equals L−T2, using either T1 or T2 as a group.

9. The method of claim 7 wherein said initially decoding comprises variable length decoding said data to identify said codeword boundaries therein.

10. The method of claim 9, further comprising:

supplying data from said buffers to a corresponding plurality of variable length decoders for decoding and uncompressing said data;

developing parallel data from said variable length decoders; and recombining said parallel data into serial data.

11. A video processing system comprising:

means for receiving constant bit rate digital data in the form of compressed and variable length coded codewords;

first variable length decoding means for determining boundary signals indicating boundaries between adjacent codewords;

demultiplex and grouping means for distributing substantially equal size groups of said codewords sequentially among a plurality of outputs under control of said boundary signals;

a plurality of buffers connected to said plurality of outputs for receiving said groups;

second variable length decoding means coupled to said plurality of buffers for decoding said groups and producing parallel data therefrom; and multiplexing means, including uncompressing means, coupled to said second variable length decoding means for uncompressing and combining said parallel data to form a serial stream of data.

12. The processing means of claim 11 wherein said digital data is formatted into portions comprising a header including variable length encoded selector data comprising a fixed number of codewords identifying discrete cosine transform coefficients that have been dropped followed by retained discrete cosine transform coefficients;

means for separating said selector data;

third variable length decoding means for variable length decoding said separated selector data; and means for utilizing said selector data for controlling said multiplexing means.

* * * * *